(12) United States Patent
Clark

(10) Patent No.: US 12,656,194 B2

(45) Date of Patent: Jun. 16, 2026

(54) SYSTEM AND METHOD FOR IDENTIFYING OPTIMAL LOCATIONS FOR STRAIN GAGE PLACEMENT ON A STRUCTURE

(71) Applicant: The Boeing Company, Chicago, IL (US)

(72) Inventor: Stephen F. Clark, St. Louis, MO (US)

(73) Assignee: The Boeing Company, Arlington, VA (US)

( * ) Notice: Subject to any disclaimer, the term of this patent is extended or adjusted under 35 U.S.C. 154(b) by 969 days.

(21) Appl. No.: 17/821,261

(22) Filed: Aug. 22, 2022

(65) Prior Publication Data

US 2024/0060835 A1     Feb. 22, 2024

(51) Int. Cl.
| | |
|---|---|
| *G01L 1/20* | (2006.01) |
| *G01L 1/22* | (2006.01) |
| *G06F 30/23* | (2020.01) |

(52) U.S. Cl.
CPC ................ *G01L 1/205* (2013.01); *G01L 1/22* (2013.01); *G06F 30/23* (2020.01)

(58) Field of Classification Search
None
See application file for complete search history.

(56) References Cited

U.S. PATENT DOCUMENTS 9,200,889 B2 * 12/2015 Swiergiel ............ G01M 5/0016
9,964,468 B1 * 5/2018 Wu .......................... G01M 5/00
(Continued)

FOREIGN PATENT DOCUMENTS

| CN | 107515980 B | * 3/2021 | ........... G06F 30/392 |
|---|---|---|---|
| CN | 113836764 A | * 12/2021 | ............. G06F 30/23 |

(Continued)

OTHER PUBLICATIONS

Hovell, P.B et al., The Interpretation of Strain Measurements for Flight Load Determination, Aeronautical Research Council Current Papers, U.D.C. No. 533.6.048.1; C.P. No. 839, Price 7s 6d Net, London, England.

(Continued)

*Primary Examiner* — Paul S Schwarzenberg

(74) *Attorney, Agent, or Firm* — Joseph M. Butscher; Carroll, Hoette & Butscher, LLC

(57)     ABSTRACT

A method for identifying optimal locations for strain gage placement on a structure includes: providing a finite element (FE) model of the structure with an initial number I of candidate strain gage locations; conducting FE analysis to produce a strain matrix [S] of strain predictions, based on a load matrix [L] of external loads being applied to the FE model; relating the matrices to each other in a linear relationship model [L]=[S][β] having a residual error function; and reducing the initial number of the candidate locations to a reduced number by using a feature selection algorithm which minimizes the residual error function until a predetermined fidelity is achieved, resulting in a subset of the coefficients in the coefficients matrix [β] being zero and a remainder of the coefficients being non-zero, wherein the non-zero coefficients correspond to respective strain matrix columns and to the reduced number of candidate locations.

20 Claims, 4 Drawing Sheets

(56) References Cited

U.S. PATENT DOCUMENTS

| | | | | |
|---|---|---|---|---|
| 11,875,093 | B2 * | 1/2024 | D'Antuono | ............. G06F 30/15 |
| 2019/0243935 | A1 * | 8/2019 | Yi | ........................ G01M 5/0008 |
| 2021/0114319 | A1 | 4/2021 | Anderson et al. | |
| 2022/0214244 | A1 * | 7/2022 | Harrigan | ................. G06F 30/12 |

FOREIGN PATENT DOCUMENTS

| | | | | | |
|---|---|---|---|---|---|
| CN | 115270492 | A | * | 11/2022 | ............. G06F 17/18 |
| CN | 111563342 | B | * | 4/2023 | |
| CN | 118734660 | B | * | 11/2024 | ............. G06F 17/16 |

OTHER PUBLICATIONS

Lokos, William A., et al., Strain-Gage Loads Calibration Parametric Study, 24th International Congress of the Aeronautical Sciences, pp. 1-28, 2004.

Jenkins, Jerald M., et al., Strain Gage Calibration of a Complex Wing, AIAA Progress in Astronautics and Aeronautics Series, Dec. 1977.

Lokos, William A., et al. Strain Gage Loads Calibration Testing of the Active Aeroelastic Wing F/A-18 Aircraft, American Institute of Aeronautics and Astronautics, May 2002.

Obozinski, Guillaume, et al. Multi-task Feature Selection, International Conference on Machine Learning.

Jenkins, Jerald M., et al., A Summary of Numerous Strain-Gage Load Calibrations on Aircrafft Wings and Tails in a Technology Format, NASA Technical Memorandum 4804, Jul. 1997.

Nelson II, Sigurd A., Strain Gage Selection in Loads Equations Using a Genetic Algorithm, NASA Contractor Report 4597, 1994, pp. 1-17.

Reardon, Lawrence F., Evaluation of a Strain-Gage Load Calibration on a Low-Aspect-Ratio Wing Structure at Elevated Temperature, NASA Technical Paper 2921, 1989, 1-35.

Skopinski, T.H., et al., Calibration of Strain-Gage Installations in Aircraft Structures for the Measurement of Flight Loads, Report 1178, Langley Aeronautical Laboratory, Virginia.

Hoffman, Karl, An Introduction to Measurements using Strain Gages, Hottinger Baldwin Messtechnik HmbH, Darmstadt, Dec. 1989, pp. 1-257.

* cited by examiner

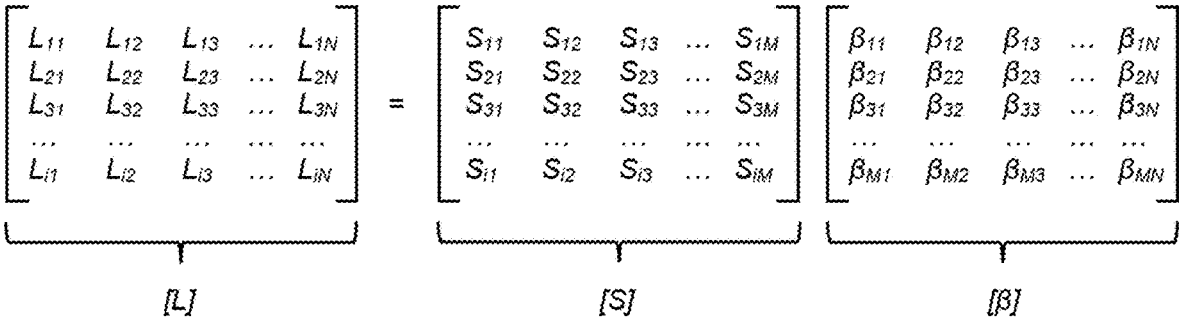
FIG. 5
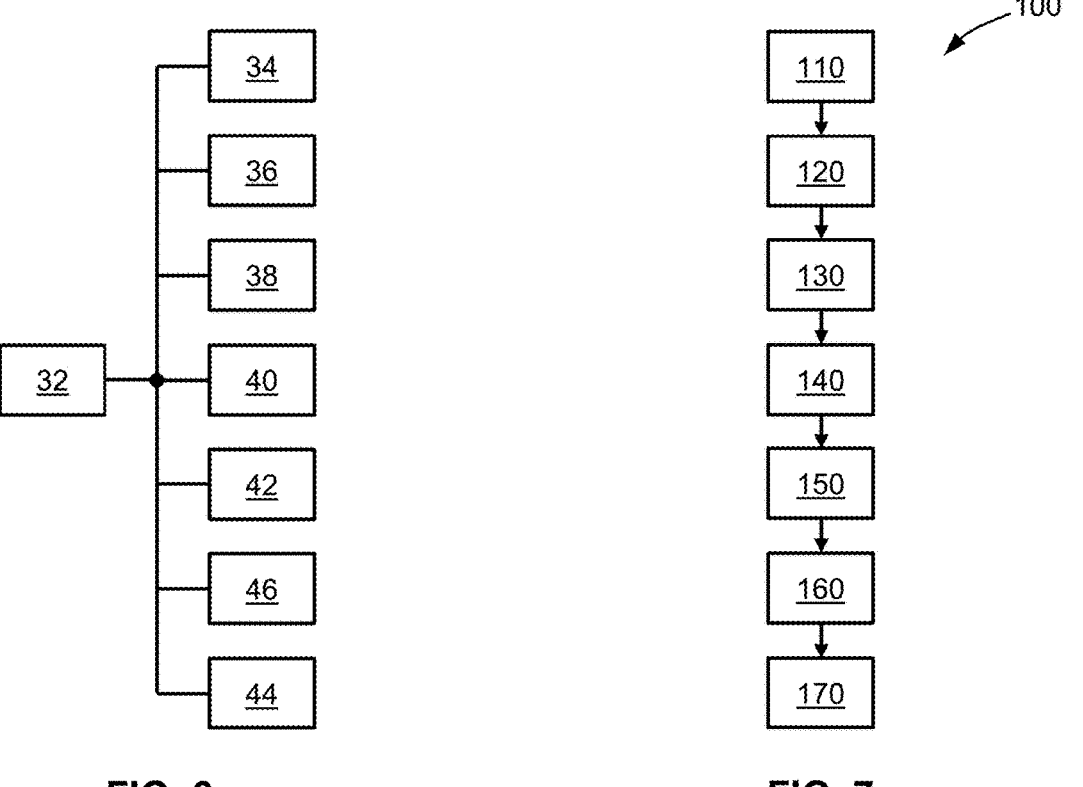
FIG. 6
FIG. 7

SYSTEM AND METHOD FOR IDENTIFYING OPTIMAL LOCATIONS FOR STRAIN GAGE PLACEMENT ON A STRUCTURE

INTRODUCTION

This disclosure relates generally to the use of strain gages on structures, and more particularly to systems and methods for identifying optimal locations for strain gage placement on structures.

In the aeronautical, aerospace and other industries, strain gages may be placed on structural members (such as wings, control surfaces and fuselages) to determine the various stresses which may be exerted on the structural member, which may be done during the design phase before the structural member is manufactured in order to predict the stresses the structural member may be subjected to for assisting with the design of the structure, and during the manufacture, assembly, inspection and servicing of manufactured parts to assist with quality control.

SUMMARY

According to one embodiment, a method for identifying optimal locations for strain gage placement on a structure includes: (i) providing a finite element model of the structure, wherein the finite element model includes a mesh of elements that correspond with an initial number I of respective candidate strain gage locations on or within the structure; (ii) conducting finite element analysis on the finite element model to produce a strain matrix [S] of strain predictions having m rows and M strain matrix columns, based on a load matrix [L] of external loads having n rows and N load matrix columns being applied to selected elements in the finite element model, wherein each of the strain matrix columns corresponds to a respective one of the candidate strain gage locations and each of the load matrix columns corresponds to a respective one of the external loads; (iii) relating the strain and load matrices to each other in a linear relationship model [L]=[S][β] having a residual error function $f$(L−Sβ), where [β] is a matrix of coefficients having b rows and B columns, and wherein each of the b rows of coefficients corresponds to a respective one of the M strain matrix columns, and wherein L, S and β represent external loads, strain predictions and coefficients, respectively, which correspond to each other according to the linear relationship model [L]=[S][β]; and (iv) applying a feature selection algorithm to the linear relationship model [L]=[S][β] to reduce the initial number I of the candidate strain gage locations to a reduced number R of the candidate strain gage locations, wherein the feature selection algorithm minimizes the residual error function $f$(L−Sβ) until a predetermined level of fidelity is achieved, resulting in a solution set in which a subset of the coefficients in the coefficients matrix are zero and a remainder of the coefficients are non-zero, wherein the non-zero coefficients correspond to respective ones of the strain matrix columns and to the reduced number R of the candidate strain gage locations.

The method may also include selecting at least some of the reduced number R of candidate strain gage locations as intended locations for strain gage placement. Additionally, the method may include placing a respective strain gage at each of the intended locations, as well as receiving a respective output signal from each respective strain gage.

The feature selection algorithm may be a least absolute shrinkage and selection (LASSO) regression algorithm, a multitask LASSO regression algorithm or an adaptive LASSO regression algorithm. Alternatively, the feature selection algorithm may be an elastic net regression algorithm, a forward stepwise regression algorithm or a backward stepwise regression algorithm.

The strain and load matrices may have the same number of rows as each other, and the number of rows b of coefficients in the [β] matrix may be equal to the number M of strain matrix columns. The strain and load matrices may each have n rows, and each $i^{th}$ set of rows in the strain and load matrices together may represent a unique set of load conditions, where i is a number from 1 to n.

The step of applying the feature selection algorithm may continue until the initial number I of the candidate strain gage locations is reduced to less than or equal to a predetermined maximum number. Alternatively, the step of applying the feature selection algorithm may continue until the residual error function $f$(L−Sβ) is less than or equal to a predetermined maximum allowable amount.

According to another embodiment, a method for identifying optimal locations for strain gage placement on a structure includes: (i) providing a finite element model of the structure, wherein the finite element model includes a mesh of elements that correspond with an initial number I of respective candidate strain gage locations on or within the structure; (ii) conducting finite element analysis on the finite element model to produce a strain matrix [S] of strain predictions having m rows and M strain matrix columns, based on a load matrix [L] of external loads having n rows and N load matrix columns being applied to selected elements in the finite element model, wherein each of the strain matrix columns corresponds to a respective one of the candidate strain gage locations and each of the load matrix columns corresponds to a respective one of the external loads; (iii) relating the strain and load matrices to each other in a linear relationship model [L]=[S][β] having a residual error function $f$(L−Sβ), where [β] is a matrix of coefficients having b rows and B columns, and wherein each of the b rows of coefficients corresponds to a respective one of the M strain matrix columns, and wherein L, S and β represent external loads, strain predictions and coefficients, respectively, which correspond to each other according to the linear relationship model [L]=[S][β]; (iv) reducing the initial number I of the candidate strain gage locations to a reduced number R of the candidate strain gage locations by using a multitask least absolute shrinkage and selection (LASSO) regression algorithm operating on the linear relationship model [L]=[S][β], wherein the multitask LASSO regression algorithm minimizes the residual error function $f$(L−Sβ) subject to a penalty term, resulting in a solution set in which a subset of the coefficients in the coefficients matrix are zero and a remainder of the coefficients are non-zero, wherein the non-zero coefficients correspond to respective ones of the strain matrix columns and to the reduced number R of the candidate strain gage locations; (v) selecting at least some of the reduced number R of candidate strain gage locations as intended locations for strain gage placement; (vi) placing a respective strain gage at each of the intended locations; and (vii) receiving a respective output signal from each respective strain gage.

In this embodiment, the strain and load matrices may have the same number of rows as each other and the number of rows b of coefficients in the [β] matrix may be equal to the number M of strain matrix columns. Here, the strain and load matrices may each have n rows, and each it h set of rows in the strain and load matrices together may represent a unique set of load conditions, where i is a number from 1 to n.

The step of reducing the initial number I of the candidate strain gage locations to a reduced number R by using the multitask LASSO regression algorithm may continue until the initial number I of the candidate strain gage locations is reduced to less than or equal to a predetermined maximum number. Alternatively, the step of reducing the initial number I of the candidate strain gage locations to a reduced number R by using the multitask LASSO regression algorithm may continue until the residual error function $f(L-S\beta)$ subject to the penalty term is less than or equal to a predetermined maximum allowable amount.

According to yet another embodiment, a system for identifying optimal locations for strain gage placement on a structure includes a finite element module, an analysis module operatively connected with the finite element module, a relationship module operatively connected with the analysis module, and a reduction module operatively connected with the relationship module. The finite element module provides a finite element model of the structure, wherein the finite element model includes a mesh of elements that correspond with an initial number I of respective candidate strain gage locations on or within the structure. The analysis module conducts finite element analysis on the finite element model to produce a strain matrix [S] of strain predictions having m rows and M strain matrix columns, based on a load matrix [L], of external loads having n rows and N load matrix columns being applied to selected elements in the finite element model, wherein each of the strain matrix columns corresponds to a respective one of the candidate strain gage locations and each of the load matrix columns corresponds to a respective one of the external loads. The relationship module relates the strain and load matrices to each other in a linear relationship model $[L]=[S][\beta]$ having a residual error function $f(L-S\beta)$, where $[\beta]$ is a matrix of coefficients having b rows and B columns, and wherein each of the b rows of coefficients corresponds to a respective one of the M strain matrix columns, and wherein L, S and β represent external loads, strain predictions and coefficients, respectively, which correspond to each other according to the linear relationship model $[L]=[S][\beta]$. Finally, the reduction module reduces the initial number I of the candidate strain gage locations to a reduced number R of the candidate strain gage locations by applying a feature selection algorithm to the linear relationship model $[L]=[S]$ [8], wherein the feature selection algorithm minimizes the residual error function $f(L-S\beta)$ until a predetermined level of fidelity is achieved, resulting in a solution set in which a subset of the coefficients in the coefficients matrix are zero and a remainder of the coefficients are non-zero, wherein the non-zero coefficients correspond to respective ones of the strain matrix columns and to the reduced number R of the candidate strain gage locations.

The system may further include a selection module, operatively connected with the reduction module, for selecting at least some of the reduced number R of candidate strain gage locations as intended locations for strain gage placement. In this embodiment, the feature selection algorithm may be a least absolute shrinkage and selection (LASSO) regression algorithm, a multitask LASSO regression algorithm, an adaptive LASSO regression algorithm, an elastic net regression algorithm, a forward stepwise regression algorithm or a backward stepwise regression algorithm. The strain and load matrices may each have n rows, and each $i^{th}$ set of rows in the strain and load matrices together may represent a unique set of load conditions, where i is a number from 1 to n. Additionally, the applying of the feature selection algorithm may continue until the initial number I of the candidate strain gage locations is reduced to less than or equal to a predetermined maximum number, or until the residual error function $f(L-S\beta)$ is less than or equal to a predetermined maximum allowable amount.

The above features and advantages, and other features and advantages, of the present teachings are readily apparent from the following detailed description of some of the best modes and other embodiments for carrying out the present teachings, as defined in the appended claims, when taken in connection with the accompanying drawings.

BRIEF DESCRIPTION OF THE DRAWINGS

FIG. 5 is a graphic representing load, strain and coefficients matrices in a linear relationship model.

FIG. 6 is a block diagram showing various feature selection algorithms.

FIG. 7 is a flowchart of a method for identifying optimal locations for strain gage placement on a structure.

DETAILED DESCRIPTION

Figure 1:
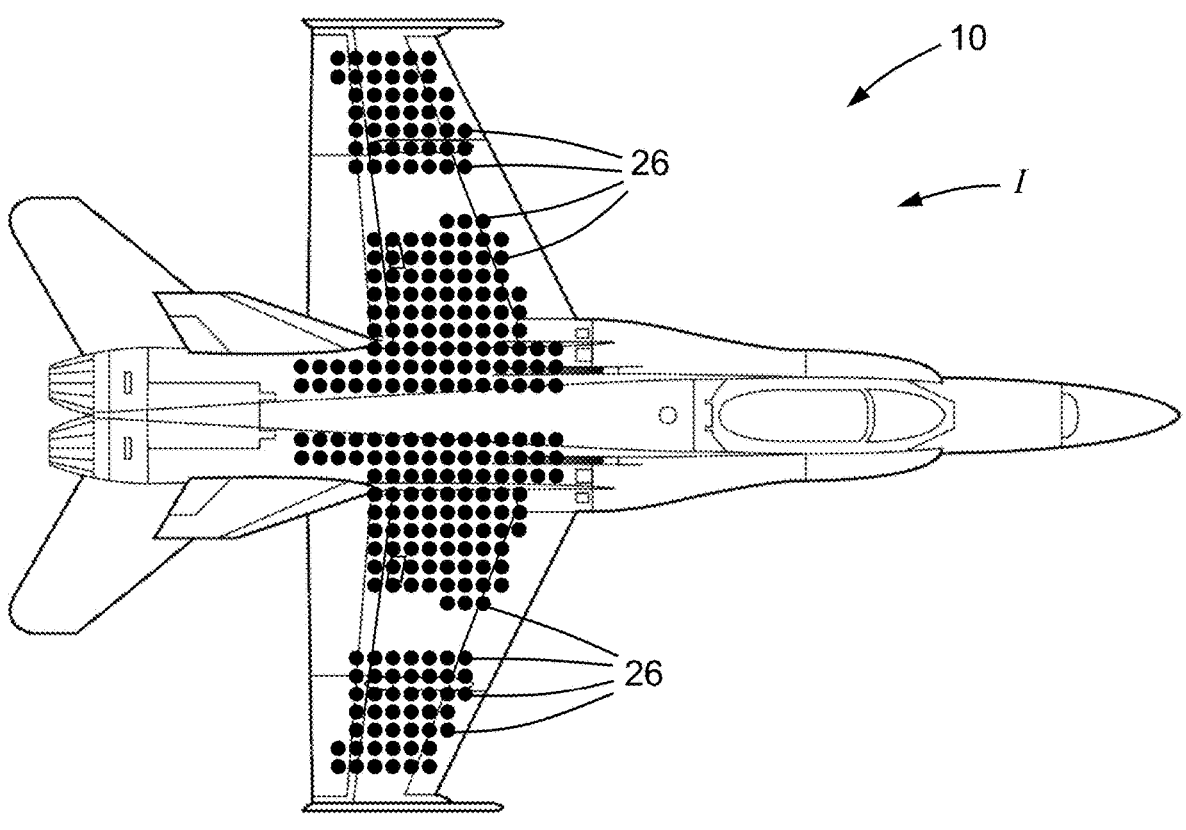
FIG. 1 is a schematic view of a structure having a plurality of candidate strain gage locations thereon.

Referring now to the drawings, wherein like numerals indicate like parts in the several views, a system 200 and method 100 for identifying optimal locations 26' for strain gage placement on a structure 10 are shown and described herein. (Note that as used herein, reference numeral 26 without a prime mark is used to indicate an initial number I of "starting" or "candidate" strain gage locations, while reference numeral 26' with a prime mark is used to indicate a reduced number R of "optimal" or "intended" candidate strain gage locations, where R is less than I.)

FIG. 1 shows a structure 10 having multiple candidate strain gage locations on the surface of the structure 10. The exemplary structure 10 shown in FIG. 1 is an aircraft wing, but the structure 10 may be any sort of load-bearing structural member. The structure 10 shown has a plurality of candidate strain gage locations 26 on its surface. These candidate strain gage locations 26 are points on or within the structure 10 where strain gages 12 could be placed for the measurement or estimation of strains 30 which are indicative of the local stresses at these points, where the stresses may be caused by various external loads 28 being exerted on the structure 10, and thus directly or indirectly being exerted on the individual locations 26. The stresses exerted on each of the locations 26 may include localized shear stresses, bending moments and torques. It is useful to know or estimate these stresses for the various candidate strain gage locations 26 in order to help in the design of the structure 10 and its various parts. For example, knowing the types and magnitudes of the localized stresses being exerted on the various parts of the structure 10 helps inform engineers and designers in the selection of materials, dimensions (e.g., thicknesses), geometries (e.g., fillets and transitions) and other aspects for the manufacture of the structure 10 and its parts.

Figure 2:
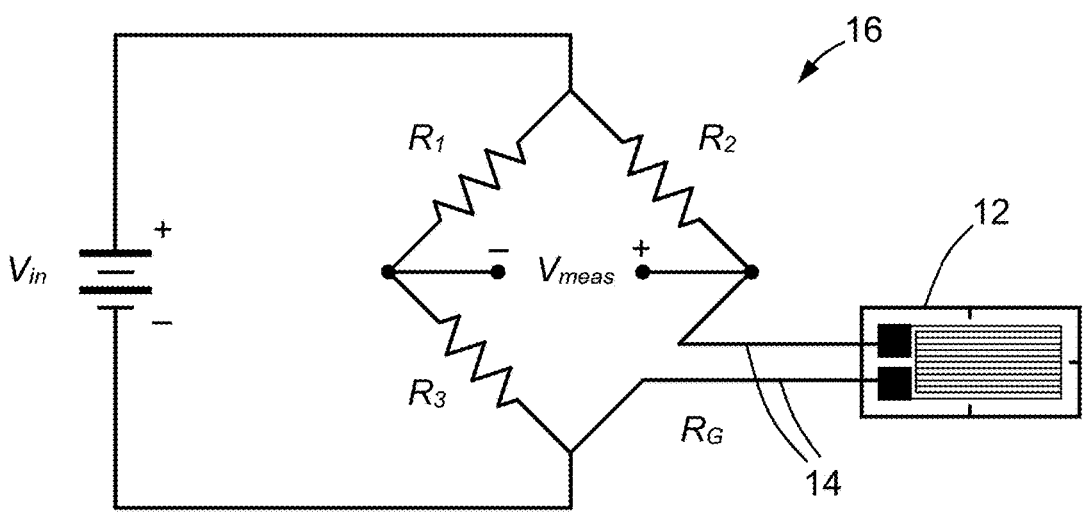
FIG. 2 is a schematic view of a strain gage connected with a Wheatstone bridge.

In theory, strain gages 12 could be densely placed across the entire surface of a structure 10. However, based on limitations of time and cost, the actual number of candidate strain gage locations 26 is typically limited. In conventional approaches, the decision of which points on the structure 10 to select as candidate strain gage locations 26 is often determined based on past experience and engineering know-how; however, this approach might not always provide the best or most optimal candidate strain gage locations 26. (Here, the "best" or "most optimal" locations 26 may be those which provide the engineer or designer with the most relevant information regarding how the structure 10 and its parts respond to various external loads 28.) Thus, in some approaches, strain gages 12 may be placed at a large number of initial locations 26, with a Wheatstone bridge 16 type of arrangement being operatively connected with each strain gage 12, as illustrated in FIG. 2. (Here, $V_{in}$ is a reference input voltage, $R_1$, $R_2$ and $R_3$ are known resistance values, $R_G$ is the resistance created by the strain gage 12 under mechanical strain, and $V_{meas}$ is a measured voltage that may be used to determine the resistance $R_G$ of the strain gage 12, from which the amount of mechanical strain may be determined.) As various loads 28 are placed on the structure 10, the array of strain gages 12 at the candidate strain gage locations 26 each produce an output signal 14 which is measured by its associated Wheatstone bridge 16 in a manner that is well known in the field of measurement and calibration. However, in order to capture all of the various types of stresses being exerted at each of the candidate strain gage locations 26, the strain gages 12 may need to be re-oriented multiple times along different directions at these locations 26, or multiple strain gages 12 oriented in different directions may be placed in close proximity to each candidate strain gage location 26. Once data has been compiled from all the output signals 14 of the strain gages 12 in their various orientations, the number of strain gage locations may be reduced to only those locations which provide the most useful information.

In contrast to this often laborious conventional approach, the method 100 and system 200 of the present disclosure provide an improved approach for identifying optimal locations 26' for strain gage placement on a structure 10.

Figure 3:
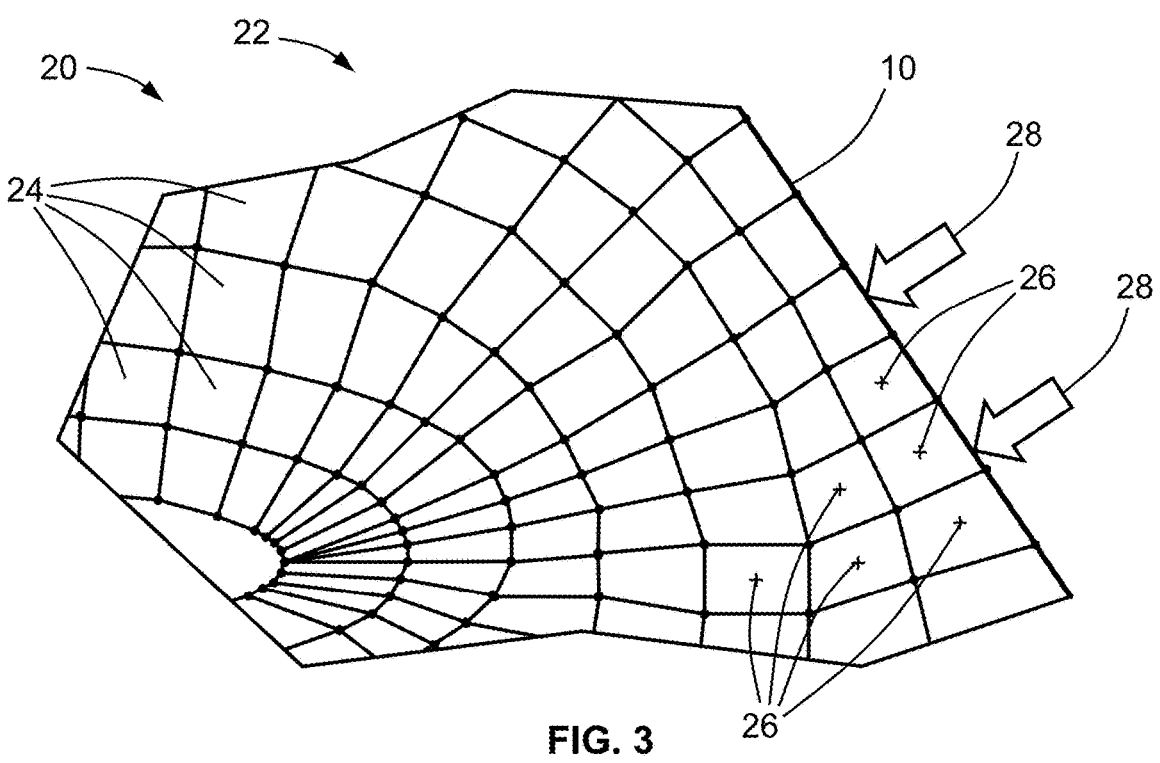
FIG. 3 is a finite element model of a portion of the structure of FIG. 1.

FIG. 3 shows a finite element model 20 of a small portion of the structure 10 of FIG. 1, which will be used as an example to help illustrate the method 100 and system 200. The finite element model 20 includes a mesh 22 of individual elements 24 that correspond with an initial number/of respective candidate strain gage locations 26 on or within the structure 10. These elements 24 may be one-dimensional linear elements (e.g., rods or beams), two-dimensional planar elements (e.g., triangles or quadrilaterals) or three-dimensional volumetric elements (e.g., pyramidal, tetrahedral or hexahedral). Note that the candidate strain gage locations 26 are illustrated in FIG. 3 as being at the center or centroid of selected elements, as denoted by the plus signs (i.e., "+"), but this is an arbitrary choice for the purpose of illustration and does not necessarily limit the candidate strain gage locations 26 to being located at the element centers or centroids. The number of elements 24 in the mesh 22 may be the same as the initial number I of candidate strain gage locations 26 (where each element 24 corresponds with a respective one of the candidate strain gage locations 26), or the number of elements 24 may be greater than the initial number I of candidate strain gage locations 26 (where each candidate strain gage location 26 corresponds with a respective group of multiple neighboring elements 24). Also note that multiple different strain gage orientations may occur at each location 26 or element 24; for example, for elements 24 meshed across a conventional x-y plane, some strain gage orientations may be suited for detecting axial stress/strain in either the x- or y-direction (i.e., $\sigma_x$ or $\sigma_y$), while other orientations may be suited for detecting shear stress/strain (i.e., $\tau_{xy}$ in the positive or negative y-direction, or, $\tau_{yx}$ in the positive or negative x-direction). Any number of external loads 28 may be applied to or exerted on the structure 10 at selected load points, as represented by these loads 28 being applied to the mesh 22 of FIG. 3 at selected elements 24 which correspond spatially with the selected load points.

Once a finite element model 20 of the structure 10 has been provided, finite element analysis is conducted on the finite element model 20 to produce a strain matrix [S] of strain predictions S having m rows and M strain matrix columns, based on a load matrix [L] of external loads L having n rows and N load matrix columns being applied to the selected elements 24 in the finite element model 20. These matrices are illustrated in FIG. 5, which is a graphic representing the load and strain matrices [L], [S], along with a coefficients matrix [β] of coefficients β having b rows and B columns, in a linear relationship model of the form [L]=[S][β]. Note that each element in the three matrices [L], [S], [β] has two subscripts, with the first subscript representing the row number within the respective matrix and the second subscript representing the column number within the respective matrix. Here, each of the strain matrix columns corresponds to a respective one of the candidate strain gage locations 26, and each of the load matrix columns corresponds to a respective one of the external loads 28.

For example, if the initial number I of candidate strain gage locations 26 for a structure 10 is chosen to be 10,000 unique locations, and if fifty different external loads 28 of interest (for calibration purposes) are applied to the structure 10 (and hence to the mesh 22 of the finite element model 20), then the strain matrix [S] will have 10,000 columns (i.e., M=10,000) and the load matrix [L] will have fifty columns (i.e., N=50). (These fifty external loads 28 may be selected for inclusion in the loads matrix [L] based on past experience, previous testing, engineering know-how, etc.) The number of rows b of coefficients β in the coefficients matrix [β] will be equal to the number M of strain matrix columns; thus, in the foregoing example, b=M=10,000 rows. The strain and load matrices [S], [L] may have the same number of rows as each other (i.e., m=n), and the load and coefficients matrices [L], [β] may have the same number of columns as each other (i.e., N=B). For example, the strain and load matrices [S], [L] may each have n rows, and each $i^{th}$ set of rows in the strain and load matrices [S], [L] together may represent a unique set of load conditions, where i is a number from 1 to n. Note that as used here, a "unique set of load conditions" means a collection of one or more point loads, shear forces and/or bending moments acting on the structure 10 at the same time. Thus, the first row in the strain matrix [S] and the first row of the loads matrix [L] may together represent a first set of loads, shear forces and/or bending moments, the second row in the strain matrix [S] and the second row of the loads matrix [L] may together represent a second set of loads, shear forces and/or bending moments which may be different from (i.e., unique as compared to) the first set of loads, shear forces and/or bending moments, and so forth. Further, note that while the lower-right element of the coefficients matrix [β] in FIG. 5 is shown as $\beta_{MN}$, this element may also be characterized as element $\beta_{bB}$.

As noted above, the strain and load matrices [S], [L] may be related to each other in the linear relationship model [L]=[S][β]. The model has a residual error function $f$(L–Sβ), where L, S and β represent external loads, strain predictions and coefficients, respectively, with these values L, S and β corresponding or relating to each other according to the linear relationship model [L]=[S][β]. For example, according to matrix algebra and the model shown in FIG. 5, the equation $L_{11}=S_{11}*\beta_{11}+S_{12}*\beta_{21}+S_{13}*\beta_{31}+\ldots+S_{1M}*\beta_{M1}$ relates particular elements from the loads matrix [L], the strain matrix [S] and the coefficients matrix [β]; therefore, the residual error of the linear relationship model for this particular equation would be represented as a function of the difference between the two sides of the equation—i.e., residual error$=L_{11}-S_{11}*\beta_{11}-S_{12}*\beta_{21}-S_{13}*\beta_{31}-\ldots-S_{1M}*\beta_{M1}$. Thus, a set of residual errors, defined by the residual error function $f$(L–Sβ), may be determined.

Once this set of residual errors is determined, a feature selection algorithm 32 is applied to the linear relationship model [L]=[S][β] with the goal of reducing the initial number I of the candidate strain gage locations 26 to some reduced number R. The feature selection algorithm 32 accomplishes this by minimizing the residual error function $f$(L–Sβ) until a predetermined level of fidelity F is achieved. (Here, the predetermined "level" may mean a predetermined amount, degree, measure or the like, and "fidelity" may mean thoroughness, completeness, granularity, specificity, diminishing returns, or the like. The predetermined level of fidelity F may also mean a predetermined number of cycles, iterations or calculations for minimizing the residual error function.) This predetermined level of fidelity F may depend on the feature selection algorithm 32 that is being used. For example, for some algorithms 32, such as a least absolute shrinkage and selection (LASSO) regression algorithm 34, the residual error function $f$(L–Sβ) may be subject to a penalty term P (e.g., with a suitable penalty term P added to the residual error function). This results in a solution set 48 in which a subset 50 of the coefficients β in the coefficients matrix [β] are zero, and the remainder 52 of the coefficients β are non-zero. In this solution set 48 of zero and non-zero coefficients the non-zero coefficients correspond to respective columns within the strain matrix [5], and thus also corresponding to the reduced number R of candidate strain gage locations 26.

Figure 4:
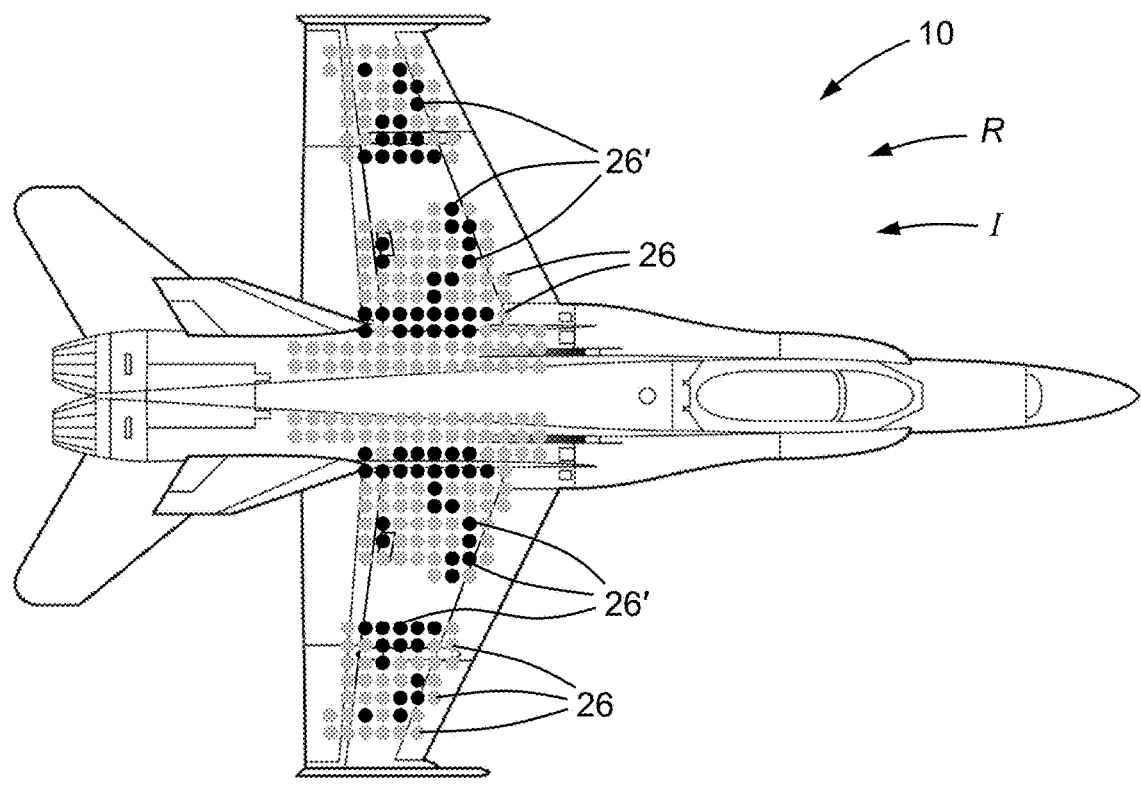
FIG. 4 is a schematic view of the structure of FIG. 1 showing the plurality of candidate strain gage locations along with a plurality of optimal strain gage locations.

FIG. 4 shows a schematic view of the structure of FIG. 1 showing both the initial number I of candidate strain gage locations 26 and the reduced number R of optimal strain gage locations 26'. Note that the candidate strain gage locations 26 are denoted by black dots in FIG. 1, and that the overall layout of these locations 26 with respect to the structure 10 is repeated in FIG. 4. However, in FIG. 4, the optimal strain gage locations 26' that are identified by the method 100 and/or system 200 are denoted by black dots, and those candidate strain gage locations 26 which are not optimal strain gage locations 26' are denoted by lighter gray dots.

As illustrated by the block diagram of FIG. 6, the feature selection algorithm 32 may be a LASSO regression algorithm 34, a multitask LASSO regression algorithm 36 or an adaptive LASSO regression algorithm 38. Alternatively, the feature selection algorithm 32 may be an elastic net regression algorithm 40, a forward stepwise regression algorithm 42, a backward stepwise regression algorithm 44 or another type 46 of feature selection algorithm 32.

In some embodiments, the step of applying the feature selection algorithm 32 may continue (e.g., through repeated iteration) until the initial number I of candidate strain gage locations 26 is reduced to less than or equal to a predetermined maximum number. For example, if the initial number I of candidate strain gage locations 26 is 10,000, the predetermined maximum number may be arbitrarily chosen to be 100, so the feature selection/error minimization process would continue until 100 or fewer candidate strain gage locations 26 are identified. Alternatively, in other embodiments, the step of applying the feature selection algorithm 32 may continue until the residual error function $f$(L–Sβ) is less than or equal to a predetermined maximum allowable amount for the penalty term P.

FIG. 7 shows a flowchart of an exemplary method 100 for identifying optimal locations 26' for strain gage placement on a structure 10. At block 110, a finite element model 20 of the structure 10 is provided, wherein the finite element model 20 includes a mesh 22 of elements 24 that correspond with an initial number I of respective candidate strain gage locations 26 on or within the structure 10. At block 120, finite element analysis is conducted on the finite element model 20 to produce a strain matrix [S] of strain predictions S having m rows and M strain matrix columns, based on a load matrix [L] of external loads L having n rows and N load matrix columns being applied to selected elements 24 in the finite element model. Here, each of the strain matrix columns corresponds to a respective one of the candidate strain gage locations 26, and each of the load matrix columns corresponds to a respective one of the external loads L. At block 130, the strain and load matrices [S], [L] are related to each other in a linear relationship model [L]=[S][β] having a residual error function $f$(L–Sβ). Here, [β] is a matrix of coefficients β having b rows and B columns, each of the b rows of coefficients β corresponds to a respective one of the M strain matrix columns, and L, S and β represent external loads, strain predictions and coefficients, respectively, which correspond to each other according to the linear relationship model [L]=[S][β]. And at block 140, a feature selection algorithm 32 is applied to the linear relationship model [L]=[S][β] to reduce the initial number I of the candidate strain gage locations 26 to a reduced number R of the candidate strain gage locations 26, wherein the feature selection algorithm 32 minimizes the residual error function $f$(L–Sβ) until a predetermined level of fidelity F is achieved. This results in a solution set 48 in which a subset 50 of the coefficients β in the coefficients matrix [β] are zero, and a remainder 52 of the coefficients β are non-zero, wherein the non-zero coefficients correspond to respective ones of the strain matrix columns and to the reduced number R of candidate strain gage locations 26.

The method 100 may also include, at block 150, selecting at least some of the reduced number R of candidate strain gage locations 26 as intended locations 26' for strain gage placement. Additionally, the method 100 may include, at block 160, placing a respective strain gage 12 at each of the intended locations 26', as well as, at block 170, receiving a respective output signal 14 from each respective strain gage 12.

Figures 8, 9:
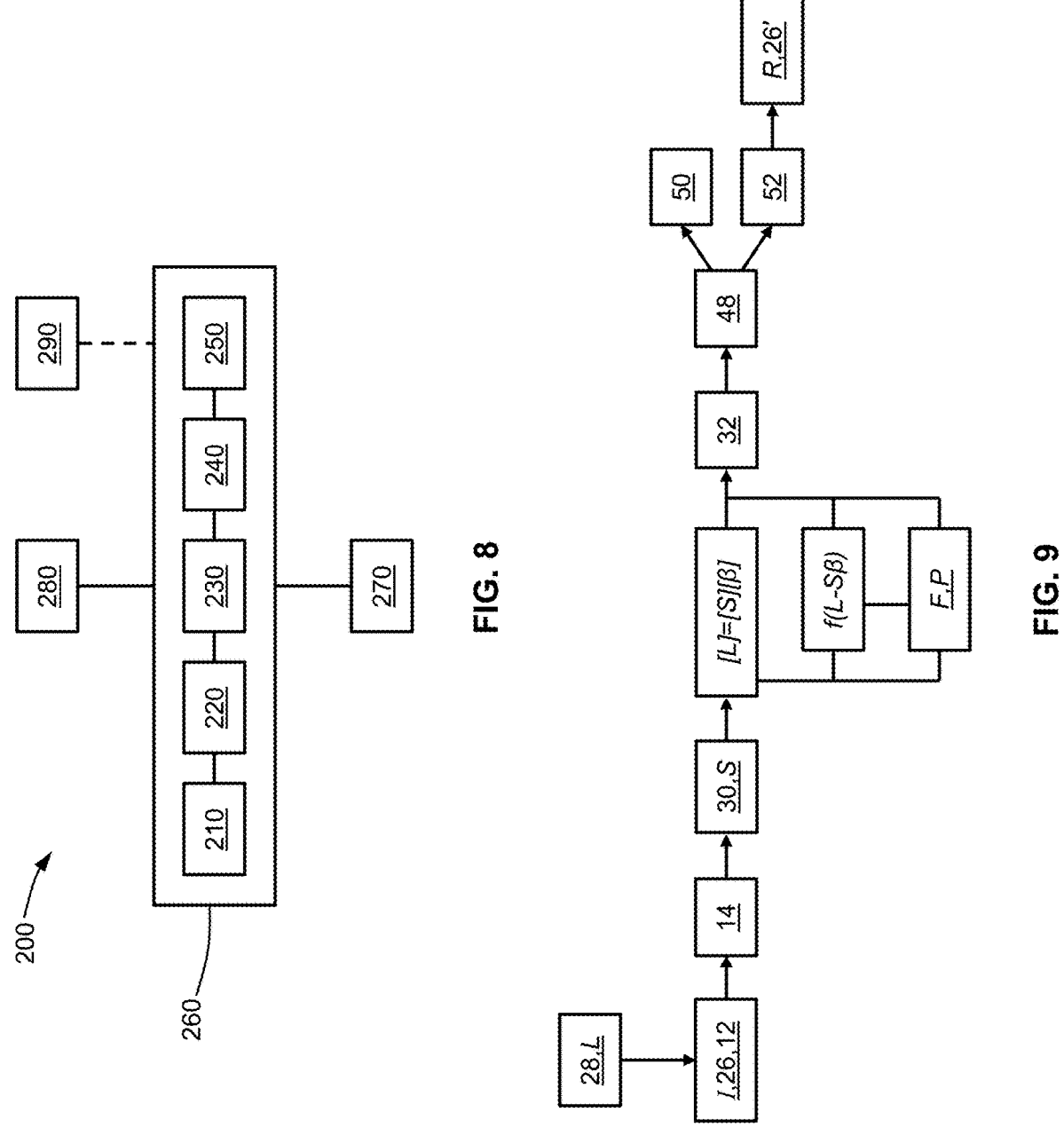
FIG. 8 is a block diagram of a system for identifying optimal locations for strain gage placement on a structure.
FIG. 9 is a flow diagram showing the flow of selected data within the method and system.

FIG. 8 shows a block diagram of an exemplary system 200 for identifying optimal locations 26' for strain gage placement on a structure 10. The system 200 includes a finite element module 210, an analysis module 220 operatively connected with the finite element module 210, a relationship module 230 operatively connected with the analysis module 220, and a reduction module 240 operatively connected with the relationship module 230. As used herein, a "module"

may include hardware and/or software, including executable instructions, for receiving one or more inputs, processing the one or more inputs, and providing one or more corresponding outputs. Also note that at some points throughout the present disclosure, reference may be made to a singular input, output, element, etc., while at other points reference may be made to plural/multiple inputs, outputs, elements, etc. Thus, weight should not necessarily be given to whether the input(s), output(s), element(s), etc. are used in the singular or plural form at any particular point in the present disclosure, as the singular and plural uses of such words should be viewed as being interchangeable, unless the specific context dictates otherwise.

The finite element module 210 provides a finite element model 20 of the structure 10, wherein the finite element model 20 includes a mesh 22 of elements 24 that correspond with an initial number I of respective candidate strain gage locations 26 on or within the structure 10. In turn, the analysis module 220 conducts finite element analysis on the finite element model 20 to produce a strain matrix [S] of strain predictions S having m rows and M strain matrix columns, based on a load matrix [L] of external loads L having n rows and N load matrix columns being applied to selected elements 24 in the finite element model 20, wherein each of the strain matrix columns corresponds to a respective one of the candidate strain gage locations 26 and each of the load matrix columns corresponds to a respective one of the external loads L.

The relationship module 230 relates the strain and load matrices [S], [β] to each other in a linear relationship model [L]=[S][β] having a residual error function $f(L-S\beta)$, where [β] is a matrix of coefficients β having b rows and B columns, and wherein each of the b rows of coefficients β corresponds to a respective one of the M strain matrix columns, and wherein L, S and β represent external loads, strain predictions and coefficients, respectively, which correspond to each other according to the linear relationship model [L]=[S][β].

The reduction module 240 reduces the initial number I of the candidate strain gage locations 26 to a reduced number R of the candidate strain gage locations 26 by applying a feature selection algorithm 32 to the linear relationship model [L]=[S][β], wherein the feature selection algorithm 32 minimizes the residual error function $f(L-S\beta)$ until a predetermined level of fidelity F is achieved, resulting in a solution set 48 in which a subset 50 of the coefficients β in the coefficients matrix [β] are zero and a remainder 52 of the coefficients β are non-zero, wherein the non-zero coefficients 52 correspond to respective ones of the strain matrix columns and to the reduced number R of the candidate strain gage locations 26.

The system 200 may further include a selection module 250, operatively connected with the reduction module 240, for selecting at least some of the reduced number R of candidate strain gage locations 26 as intended locations 26' for strain gage placement. The feature selection algorithm 32 may be a LASSO regression algorithm 34, a multitask LASSO regression algorithm 36, an adaptive LASSO regression algorithm 38, an elastic net regression algorithm 40, a forward stepwise regression algorithm 42 or a backward stepwise regression algorithm 44. The strain and load matrices [5], [L] may each have n rows, and each $i^{th}$ set of rows in the strain and load matrices [S], [L] together may represent a unique set of load conditions, where i is a number from 1 to n. Additionally, the applying of the feature selection algorithm 32 may continue until the initial number I of the candidate strain gage locations 26 is reduced to less than or equal to a predetermined maximum number, or until the residual error function $f(L-S\beta)$ is less than or equal to a predetermined maximum allowable amount.

The system 200 and its modules may be part of an interface device 260, such as a computer, workstation, mobile phone, tablet or the like. The interface device 260 enables human interaction with the system 200, and may include one or more processors to facilitate memory, computation, receiving inputs from one or more input devices 270 (e.g., keyboard, mouse, touchpad), sending outputs to one or more output devices (e.g., display screens), and interacting with a network 290 (e.g., a local area network, the cloud, etc.).

FIG. 9 illustrates the flow of selected data as the method 100 is executed and as the system 200 is operated. The external loads 28 act on the structure 10 at the initial number I of candidate strain gage locations 26, causing strains 30 which are detected by the strain gages 12, with the strain gages 12 outputting respective output signals 14. The external loads 28 are represented by the L values in the loads matrix [L], and the strains or strain predictions 30 are represented by the S values in the strain matrix [S]. These values are fed into the linear relationship model [L]=[S] which has an associated residual error function $f(L-S\beta)$ and a predetermined level of fidelity F (and optionally a penalty term P), and the feature selection algorithm 32 is applied as described above to produce a solution set 48 in which a subset 50 of the coefficients β in the coefficients matrix [β] are zero and a remainder 52 of the coefficients β are non-zero. As noted above, the non-zero coefficients 52 correspond to respective ones of the strain matrix columns and relatedly to the reduced number R of the candidate strain gage locations 26, which are the intended or optimal locations 26'.

According to another embodiment, a method 100 for identifying optimal locations 26' for strain gage placement on a structure 10 includes: (i) at block 110, providing a finite element model 20 of the structure 10, where the finite element model 20 includes a mesh 22 of elements 24 that correspond with an initial number I of respective candidate strain gage locations 26 on or within the structure 10; (ii) at block 120, conducting finite element analysis on the finite element model 20 to produce a strain matrix [S] of strain predictions S having m rows and M strain matrix columns, based on a load matrix [L] of external loads L having n rows and N load matrix columns being applied to selected elements 24 in the finite element model 20, wherein each of the strain matrix columns corresponds to a respective one of the candidate strain gage locations 26 and each of the load matrix columns corresponds to a respective one of the external loads L; (iii) at block 130, relating the strain and load matrices [5], [L] to each other in a linear relationship model [L]=[S][β] having a residual error function $f(L-S\beta)$, where [β] is a matrix of coefficients β having b rows and B columns, and wherein each of the b rows of coefficients β corresponds to a respective one of the M strain matrix columns, and wherein L, S and β represent external loads, strain predictions and coefficients, respectively, which correspond to each other according to the linear relationship model [L]=[S][β]; (iv) at block 140, reducing the initial number I of the candidate strain gage locations 26 to a reduced number R of the candidate strain gage locations 26 by using a multitask least absolute shrinkage and selection (LASSO) regression algorithm 36 operating on the linear relationship model [L]=[S][β], wherein the multitask LASSO regression algorithm 36 minimizes the residual error function $f(L-S\beta)$ subject to a penalty term P, resulting in a solution set 48 in which a subset 50 of the coefficients β in the coefficients matrix are zero and a remainder 52 of the coefficients β are non-zero, wherein the non-zero coefficients 52 correspond to respective ones of the strain matrix columns and to the reduced number R of the candidate strain gage locations 26; (v) at block 150, selecting at least some of the reduced number R of candidate strain gage locations 26 as intended locations 26' for strain gage placement; (vi) at block 160, placing a respective strain gage 12 at each of the intended locations 26; and (vii) at block 170, receiving a respective output 14 signal from each respective strain gage 12.

In this embodiment, the strain and load matrices [S], [L] may have the same number of rows m, n as each other and the number of rows b of coefficients β in the [β] matrix may be equal to the number M of strain matrix columns Here, the strain and load matrices [S], may each have n rows, and each $i^{th}$ set of rows in the strain and load matrices [S], [L] together may represent a unique set of load conditions, where i is a number from 1 to n.

The step of reducing the initial number I of the candidate strain gage locations to a reduced number R by using the multitask LASSO regression algorithm 36 may continue until the initial number I of the candidate strain gage locations 26 is reduced to less than or equal to a predetermined maximum number. Alternatively, the step of reducing the initial number I of the candidate strain gage locations to a reduced number R by using the multitask LASSO regression algorithm 36 may continue until the residual error function $f(L-S\beta)$ subject to the penalty term P is less than or equal to a predetermined maximum allowable amount.

While various steps of the method 100 have been described as being separate blocks, and various functions of the system 200 have been described as being separate modules or elements, it may be noted that two or more steps may be combined into fewer blocks, and two or more functions may be combined into fewer modules or elements. Similarly, some steps described as a single block may be separated into two or more blocks, and some functions described as a single module or element may be separated into two or more modules or elements. Additionally, the order of the steps or blocks described herein may be rearranged in one or more different orders, and the arrangement of the functions, modules and elements may be rearranged into one or more different arrangements.

The above description is intended to be illustrative, and not restrictive. While the dimensions and types of materials described herein are intended to be illustrative, they are by no means limiting and are exemplary embodiments. In the following claims, use of the terms "first", "second", "top", "bottom", etc. are used merely as labels, and are not intended to impose numerical or positional requirements on their objects. As used herein, an element or step recited in the singular and preceded by the word "a" or "an" should be understood as not excluding plural of such elements or steps, unless such exclusion is explicitly stated. Additionally, the phrase "at least one of A and B" and the phrase "A and/or B" should each be understood to mean "only A, only B, or both A and B". Moreover, unless explicitly stated to the contrary, embodiments "comprising" or "having" an element or a plurality of elements having a particular property may include additional such elements not having that property. And when broadly descriptive adverbs such as "substantially" and "generally" are used herein to modify an adjective, these adverbs mean "mostly", "mainly", "for the most part", "to a significant extent", "to a large degree" and/or "at least 51 to 99% out of a possible extent of 100%", and do not necessarily mean "perfectly", "completely", "strictly", "entirely" or "100%". Additionally, the word "proximate" may be used herein to describe the location of an object or portion thereof with respect to another object or portion thereof, and/or to describe the positional relationship of two objects or their respective portions thereof with respect to each other, and may mean "near", "adjacent", "close to", "close by", "at" or the like.

This written description uses examples, including the best mode, to enable those skilled in the art to make and use devices, systems and compositions of matter, and to perform methods, according to this disclosure. It is the following claims, including equivalents, which define the scope of the present disclosure.

What is claimed is:

1. A method comprising:

providing one or more strain gages;

providing a structure;

providing a finite element model of the structure, wherein the finite element model includes a mesh of elements that correspond with an initial number I of respective candidate strain gage locations on or within the structure;

conducting finite element analysis on the finite element model to produce a strain matrix [S] of strain predictions having m rows and M strain matrix columns, based on a load matrix [L] of external loads having n rows and N load matrix columns being applied to selected elements in the finite element model, wherein each of the strain matrix columns corresponds to a respective one of the candidate strain gage locations and each of the load matrix columns corresponds to a respective one of the external loads;

relating the strain and load matrices to each other in a linear relationship model [L]=[S][β] having a residual error function $f(L-S\beta)$, where [β] is a matrix of coefficients having b rows and B columns, and wherein each of the b rows of coefficients corresponds to a respective one of the M strain matrix columns, and wherein L, S and β represent external loads, strain predictions and coefficients, respectively, which correspond to each other according to the linear relationship model [L]=[S][β];

applying a feature selection algorithm to the linear relationship model [L]=[S][β] to reduce the initial number I of the candidate strain gage locations to a reduced number R of the candidate strain gage locations, wherein the feature selection algorithm minimizes the residual error function $f(L-S\beta)$ until a predetermined level of fidelity is achieved, resulting in a solution set in which a subset of the coefficients in the coefficients matrix are zero and a remainder of the coefficients are non-zero, wherein the non-zero coefficients correspond to respective ones of the strain matrix columns and to the reduced number R of the candidate strain gage locations; and placing the one or more strain gages on the structure at one or more of the reduced number R of the candidate strain gage locations.

2. The method of claim 1, further comprising:

selecting at least some of the reduced number R of candidate strain gage locations as intended locations for strain gage placement.

3. The method of claim 2, further comprising:

placing a respective strain gage at each of the intended locations.

4. The method of claim 3, further comprising:

receiving a respective output signal from each respective strain gage.

5. The method of claim 1, wherein the feature selection algorithm is a least absolute shrinkage and selection (LASSO) regression algorithm, a multitask LASSO regression algorithm or an adaptive LASSO regression algorithm.

6. The method of claim 1, wherein the feature selection algorithm is an elastic net regression algorithm, a forward stepwise regression algorithm or a backward stepwise regression algorithm.

7. The method of claim 1, wherein the strain and load matrices have the same number of rows as each other and the number of rows b of coefficients in the [β] matrix is equal to the number M of strain matrix columns.

8. The method of claim 7, wherein the strain and load matrices each have n rows, and where each $i^{th}$ set of rows in the strain and load matrices together represent a unique set of load conditions, where i is a number from 1 to n.

9. The method of claim 1, wherein the step of applying the feature selection algorithm continues until the initial number I of the candidate strain gage locations is reduced to less than or equal to a predetermined maximum number.

10. The method of claim 1, wherein the step of applying the feature selection algorithm continues until the residual error function $f(L-S\beta)$ is less than or equal to a predetermined maximum allowable amount.

11. A method for identifying optimal locations for strain gage placement on a structure, comprising:

providing one or more strain gages;

providing a structure;

providing a finite element model of the structure, wherein the finite element model includes a mesh of elements that correspond with an initial number I of respective candidate strain gage locations on or within the structure;

conducting finite element analysis on the finite element model to produce a strain matrix [S] of strain predictions having m rows and M strain matrix columns, based on a load matrix [L] of external loads having n rows and N load matrix columns being applied to selected elements in the finite element model, wherein each of the strain matrix columns corresponds to a respective one of the candidate strain gage locations and each of the load matrix columns corresponds to a respective one of the external loads;

relating the strain and load matrices to each other in a linear relationship model [L]=[S][β] having a residual error function $f(L-S\beta)$, where [β] is a matrix of coefficients having b rows and B columns, and wherein each of the b rows of coefficients corresponds to a respective one of the M strain matrix columns, and wherein L, S and β represent external loads, strain predictions and coefficients, respectively, which correspond to each other according to the linear relationship model [L]=[S][β];

reducing the initial number I of the candidate strain gage locations to a reduced number R of the candidate strain gage locations by using a multitask least absolute shrinkage and selection (LASSO) regression algorithm operating on the linear relationship model [L]=[S][β], wherein the multitask LASSO regression algorithm minimizes the residual error function $f(L-S\beta)$ subject to a penalty term, resulting in a solution set in which a subset of the coefficients in the coefficients matrix are zero and a remainder of the coefficients are non-zero, wherein the non-zero coefficients correspond to respective ones of the strain matrix columns and to the reduced number R of the candidate strain gage locations;

selecting at least some of the reduced number R of candidate strain gage locations as intended locations for strain gage placement;

placing a respective strain gage at each of the intended locations; and receiving a respective output signal from each respective strain gage.

12. The method of claim 11, wherein the strain and load matrices have the same number of rows as each other and the number of rows b of coefficients in the [β] matrix is equal to the number M of strain matrix columns.

13. The method of claim 12, wherein the strain and load matrices each have n rows, and where each $i^{th}$ set of rows in the strain and load matrices together represent a unique set of load conditions, where i is a number from 1 to n.

14. The method of claim 11, wherein the step of reducing the initial number I of the candidate strain gage locations to a reduced number R by using the multitask LASSO regression algorithm continues until the initial number I of the candidate strain gage locations is reduced to less than or equal to a predetermined maximum number.

15. The method of claim 11, wherein the step of reducing the initial number I of the candidate strain gage locations to a reduced number R by using the multitask LASSO regression algorithm continues until the residual error function $f(L-S\beta)$ subject to the penalty term is less than or equal to a predetermined maximum allowable amount.

16. A system comprising:

a structure;

one or more strain gages; and hardware comprising:

a finite element module for providing a finite element model of the structure, wherein the finite element model includes a mesh of elements that correspond with an initial number I of respective candidate strain gage locations on or within the structure;

an analysis module, operatively connected with the finite element module, for conducting finite element analysis on the finite element model to produce a strain matrix [S] of strain predictions having m rows and M strain matrix columns, based on a load matrix [L] of external loads having n rows and N load matrix columns being applied to selected elements in the finite element model, wherein each of the strain matrix columns corresponds to a respective one of the candidate strain gage locations and each of the load matrix columns corresponds to a respective one of the external loads;

a relationship module, operatively connected with the analysis module, for relating the strain and load matrices to each other in a linear relationship model [L]=[S][β] having a residual error function $f(L-S\beta)$, where [β] is a matrix of coefficients having b rows and B columns, and wherein each of the b rows of coefficients corresponds to a respective one of the M strain matrix columns, and wherein L, S and β represent external loads, strain predictions and coefficients, respectively, which correspond to each other according to the linear relationship model [L]=[S][β]; and a reduction module, operatively connected with the relationship module, for reducing the initial number I of the candidate strain gage locations to a reduced number R of the candidate strain gage locations by applying a feature selection algorithm to the linear relationship model $[L]=[S][\beta]$, wherein the feature selection algorithm minimizes the residual error function $f(L-S\beta)$ until a predetermined level of fidelity is achieved, resulting in a solution set in which a subset of the coefficients in the coefficients matrix are zero and a remainder of the coefficients are non-zero, wherein the non-zero coefficients correspond to respective ones of the strain matrix columns and to the reduced number R of the candidate strain gage locations, wherein the one or more strain gages are placed at one or more of the reduced number R of the candidate strain gage locations.

17. The system of claim 16, wherein the hardware further comprises:

a selection module, operatively connected with the reduction module, for selecting at least some of the reduced number R of candidate strain gage locations as intended locations for strain gage placement.

18. The system of claim 16, wherein the feature selection algorithm is a least absolute shrinkage and selection (LASSO) regression algorithm, a multitask LASSO regression algorithm, an adaptive LASSO regression algorithm, an elastic net regression algorithm, a forward stepwise regression algorithm or a backward stepwise regression algorithm.

19. The system of claim 16, wherein the strain and load matrices each have n rows, and where each $i^{th}$ set of rows in the strain and load matrices together represent a unique set of load conditions, where i is a number from 1 to n.

20. The system of claim 16, wherein the applying of the feature selection algorithm continues until the initial number I of the candidate strain gage locations is reduced to less than or equal to a predetermined maximum number or until the residual error function $f(L-S\beta)$ is less than or equal to a predetermined maximum allowable amount.

\* \* \* \* \*